United States Patent [19]

Kub

[11] Patent Number: 5,083,174

[45] Date of Patent: Jan. 21, 1992

[54] FLOATING GATE MAGNETIC FIELD SENSOR

[75] Inventor: Francis J. Kub, Arnold, Md.

[73] Assignee: The United States of America as represented by the Secretary of the Navy, Washington, D.C.

[21] Appl. No.: 560,700

[22] Filed: Jul. 31, 1990

[51] Int. Cl.[5] .............. H01L 27/22; H01L 29/68; H01L 29/82; H01L 43/00

[52] U.S. Cl. .............. 357/27; 357/23.5; 357/23.6; 357/85; 357/51

[58] Field of Search .............. 357/27, 23.5, 23.6, 357/85, 51; 307/575

[56] References Cited

U.S. PATENT DOCUMENTS 4,855,800  8/1989  Esquivel et al. .............. 357/23.5

FOREIGN PATENT DOCUMENTS 0096190  12/1983  European Pat. Off. .............. 357/27
0096218  12/1983  European Pat. Off. .............. 357/27

OTHER PUBLICATIONS

"Hall Effect Device Feedback Circuit", Collins, IBM Tech. Dis. Bulletin, vol. 13, #8, Jan. 1971, p. 2448.
"Semiconductor Magnetic Field Sensor", Freeman et al., IBM Tech. Dis. Bulletin, vol. 18, #5, Oct. 1975, pp. 1389-1390.
"Magnetic and Electrical Properties of N-Channel MOS Hall-Effect Device", Yagi et al., Jap. J. of Appl. Phys., vol. 15, #4, Apr. 1976, pp. 655-661.

*Primary Examiner*—Rolf Hille
*Assistant Examiner*—Mahshid Saadat
*Attorney, Agent, or Firm*—Thomas E. McDonnell; George Jameson

[57] ABSTRACT

A magnetic field sensor uses a MOSFET comprising an silicon layer with a source at one end and first and second drains at the other end, and a layer of silicon dioxide applied to the silicon layer between the source and the drain. The gate of the MOSFET is a floating gate assembly provided on the top surface of the silicon dioxide layer and comprising a DC gate for receiving a DC voltage and producing electron charge movement at or near the interface between the silicon and silicon dioxide layers, and first and second floating gates located adjacent to the first and second drains, respectively. A charge splitter channel divides the first floating gate and the first drain from the second floating gate and the second drain. An output signal is taken from each floating gate based upon the electron charges in the silicon dioxide layer below each respective floating gate, wherein the movement of the electron charges is deflected based upon the strength of the magnetic field, thereby causing more electron charges to be deflected towards one or the other of the two floating gates.

15 Claims, 4 Drawing Sheets

FLOATING GATE MAGNETIC FIELD SENSOR

FIELD OF THE INVENTION

The present invention relates to magnetic field sensors using a MOSFET semiconductor as the sensing element and, more particularly, to a magnetic field sensor having improved sensitivity, which incorporates a MOSFET with split floating gates that provide capacitive coupling of output signals as a function of the strength of the magnetic field being sensed.

BACKGROUND OF THE INVENTION

A conventional method of implementing a magnetic field sensor using a MOSFET device is with the use of a special MOSFET having split drains in addition to the source and gate. A bias voltage applied to the device causes current flow between the source and the drains. A magnetic field perpendicular to the surface of the MOSFET causes a Lorentz deflection of the current flow in the gate channel so that current is deflected towards one or the other of the two split drains. The resultant imbalance in the drain current is used to sense the magnetic field strength. This current imbalance is typically measured by sensing the difference in voltage developed on two load resistors using a differential amplifier connected directly to the outputs of the split drains of the MOSFET. Improved sensitivity on the order of $10^3$ V/AT has been achieved by using the split drain approach, which is approximately a factor of 10 improvement over magnetic field sensitivity realized with use of conventional Hall Effect MOSFET devices.

A disadvantage of the use of load resistors in a conventional split drain MOSFET structure is that an undesirable noise component is introduced in the output signal. A load resistor has what is known as a "Johnson noise" current component associated with it, where the mean-square noise current is given by:

$$\overline{I^2}_n = 4kTB/R_L \quad (1)$$

in which k is Boltzman's constant, T is the absolute temperature, B is the noise bandwidth and $R_L$ is the load resistor value. The noise current of equation (1) exists independently of whether or not a signal current is present. Therefore, the use of a conventional split drain MOSFET structure as a magnetic field sensor inherently introduces an adverse noise component that limits the sensitivity of the sensor.

Undesirable signal noise is also introduced in the conventional MOSFET split drain sensor as a result of the receiver used with the sensor. A common method of sensing low level current signals is to use either a transimpedance receiver (amplifier) or a high impedance current sensing receiver. The mean-square noise current associated with both methods is given by the expression:

$$\overline{I^2}_n = 4kTB/R_L + \overline{e^2}_{na} B/R^2_L + [4/3]\pi^2 \overline{e^2}_{na} C^2 B^3 \quad (2)$$

with the symbols used being as noted above with respect to equation (1), and where $e^2na$ is the amplifier equivalent mean-square input noise voltage, and C is the capacitance at the sensing node (with contributions from 1/f and shot noise being neglected).

Graphs wherein the mean-square noise current per unit frequency from equation (2) is plotted as a function of the noise equivalent bandwidth, B(MHz), demonstrate that the resistor noise dominates at low bandwidths and that the mean-square noise current per unit frequency due to the resistor is inversely proportional to the resistor value. Therefore, increasing the value of the load resistor reduces the mean-square noise current. However, in a transimpedance amplifier this increase can cause the amplifier to oscillate, while in the case of a high impedance receiver, a large equalization ratio is required. Therefore, both receiving methods suffer specific disadvantages.

It will be appreciated from the foregoing that even with the improved sensitivity provided by this type of split drain MOSFET structure, the use thereof as a magnetic field sensor is limited by noise inherent in both the load resistor and the sensing circuitry of the device. Thus, while prior art MOSFET magnetic field sensors of the type described above are satisfactory for many applications, such sensors do not, in general, provide the advantages of the invention described below.

SUMMARY OF THE INVENTION

In accordance with the invention, a MOSFET magnetic field sensor of the type discussed above is provided in which the aforementioned problems experienced with prior art MOSFET sensor structures are overcome, and the sensitivity of the sensor is significantly improved.

According to a first aspect of the invention, an improvement is provided in a magnetic field sensor comprising a MOSFET comprising a silicon layer with a source at a first end of the silicon layer, a first drain and a second drain at a second end of the silicon layer, a layer of silicon dioxide disposed on the silicon layer between the first end and the second end, and gate means disposed between the first end and the second end of the MOSFET. The improvement concerns the provision of gate means comprising a DC gate means disposed on an upper surface of the silicon dioxide layer adjacent to the source for receiving a DC voltage and producing movement within a carrier conducting channel in the silicon layer, of electron charges along a path of travel which is a function of the strength of the magnetic field being sensed, and first and second floating gate means located on an upper surface of the silicon dioxide layer adjacent to the first drain and the second drain, respectively, for providing capacitive coupling to electron charges beneath the respective floating gates, and for outputting first and second gate signals, respectively, indicative of the electron charges therebelow. An isolating barrier region separates the first floating gate means and first drain from the second floating gate means and second drain, and a charge splitter means located in the isolating barrier region prevents charges from accumulating in the isolating barrier region. Output means are connected to the first and second floating gate means comprising a differential amplifier means having a first input connected to receive the first gate signal and a second input connected to receive the second gate signal, and for providing a differential output signal based on the gate signals related to the strength of the magnetic field.

In further accordance with the foregoing, the first floating gate means comprises a first bias means for providing a bias voltage to a first floating gate, and the second floating gate means comprises a second bias means for providing a bias voltage to a second floating gate. These bias means comprise bias resistors in one embodiment, while in another embodiment, the bias voltage is established by capacitive division using a bias electrode, rather than a resistor, for minimizing noise interference in the output signal. A third embodiment for biasing the floating gates involves the use of reverse biased p-n junction diodes with one terminal of the p-n diode being connected to a voltage of the desired bias level and the other terminal connected to each of the first and second floating gates. Filtering means are connected to receive the differential output signal means for filtering out undesired noise from the differential output signal.

In an alternative embodiment of similar construction, a MOSFET magnetic field sensor is provided which comprises a single drain and a plurality of floating gates on the top surface of the silicon dioxide layer between the DC gate means and the drain, each floating gate being at least partially separated from an adjacent floating gate by a channel. Output signals are provided from a first floating gate at a first outermost edge of the epitaxial layer, and from a second floating gate at a second outermost edge of the epitaxial layer, with the remaining floating gates therebetween serving as "dummy" gates with no output taken therefrom.

In accordance with a further aspect of the invention, a floating gate MOSFET sensor structure as described above is further provided with a metal gate over a gap region, located between the DC gate means and the floating gates on the top surface of the silicon dioxide layer so as to prevent electron charge build-up in the gap region, and to increase the capacitive coupling employed in producing floating gate output signals.

Other features and advantages of the present invention are set forth in, or will be apparent from, the following detailed description of the preferred embodiments of the invention taken in conjunction with the accompanying drawings.

DETAILED DESCRIPTION OF THE PREFERRED EMBODIMENTS

Figure 1:
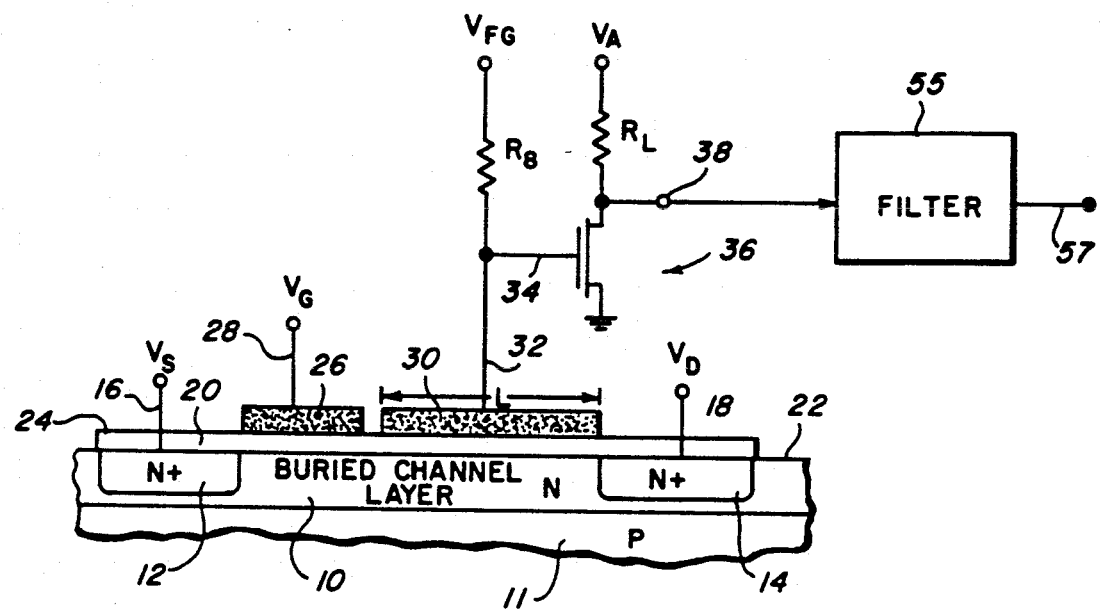
FIG. 1 is a cross-sectional view of a floating gate magnetic field sensor and including a schematic circuit diagram of amplifier and filtering circuitry connected to an output of a floating gate of the sensor.

Referring to FIG. 1, a semiconductor MOSFET or MISFET device is shown comprising buried channel silicon conducting layer 10 in which is formed at one end thereof a source 12 and, at the opposite end, a drain 14. A layer of silicon dioxide 20 is placed on a top surface 22 of the buried channel silicon layer 10 between source 12 and drain 14. Buried channel devices can be formed either by implanting the N-type layer 10 in a P-type silicon substrate 11 comprising P-material or by growing the N type layer 10 epitaxially. In alternative arrangements, the material of both substrate 11 and buried channel layer 10 can be comprised of gallium arsenide (GaAs), indium phosphate (InP), indium antimonide (InSb) or other high mobility materials passivated by appropriate dielectric materials. In addition, the invention is equally applicable to surface channel MOSFET devices wherein layer 10 is eliminated and the dopant (P) of the substrate 11 is opposite that of the source 12 and drain 14 (N+). In buried channel devices, carriers are conducted in a minimum potential region slightly below the silicon-silicon dioxide interface while in a surface channel device carriers are conducted at the interface between the silicon and silicon dioxide. A bias potential is established across the silicon conducting layer 10 by applying a source voltage $V_S$ and a drain voltage $V_D$ at a source terminal or node 16 and a drain terminal or node 18, respectively.

The MOSFET device as described up to now is conventional. In accordance with the present invention, the basic MOSFET structure is modified as described below and used as a magnetic field sensor to provide an output signal indicative of the magnetic field strength. In this regard, the gate of the MOSFET of FIG. 1 is disposed on the upper surface 24 of silicon dioxide layer 20 and comprises a DC voltage gate 26 with a DC gate terminal or node 28 connected thereto and a floating gate 30 located adjacent to DC voltage gate 26. Floating gate 30 is of length L and has a floating gate output connector 32 connected to an input 34 of a MOSFET electrometer amplifier 36. A bias voltage is developed on floating gate 30 and at input 34 by the connection of a bias resistor $R_B$ between a floating gate supply voltage $V_{FG}$ and input 34. MOSFET electrometer amplifier 36 includes an output terminal 38 and a load resistor $R_L$ is connected to supply voltage $R_V$. The gate structure just described can be referred to as a "floating gate" current sensor.

Figure 2:
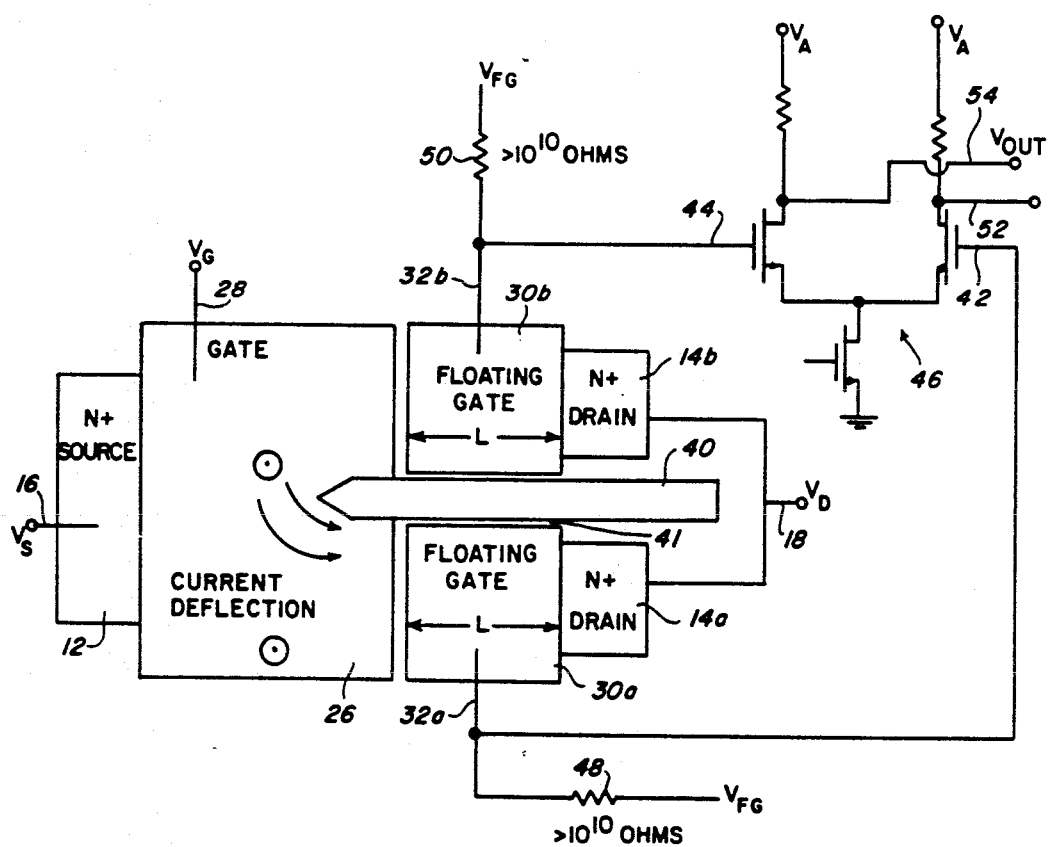
FIG. 2 is a top view of a floating gate magnetic field sensor according to the invention using dual floating gates and split drains, and including a schematic circuit diagram of output amplifier circuitry connected to each floating gate.

One preferred embodiment of the invention is shown in FIG. 2, which is similar to the magnetic field sensor of FIG. 1, and in which corresponding components have been given the same reference numerals as in FIG. 1. In FIG. 2, the floating gate comprises split floating gates 30a and 30b, and the drain comprises split drains 14a, 14b disposed adjacent to split floating gates 30a and 30b, respectively. A charge splitter 40 is located in an isolating barrier region 41 which separates split floating gate 30a and split drain 14a, on one side, from split floating gate 30b and split drain 14b, on the other side, as shown in FIG. 2. Dual output connectors 32a, 32b are connected from split floating gates 30a and 30b, respectively, to gate inputs 42 and 44, respectively, of an output differential electrometer amplifier 46, which comprises a MOSFET differential amplifier in the embodiment illustrated. A bias voltage is applied to each of the gate inputs 42 and 44 of differential electrometer amplifier 46 through corresponding bias resistors 48 and 50 each connected between a floating gate voltage supply $V_{FG}$ and the respective inputs 42 and 44. Bias resistors 48, 50 are large value resistors, each preferably being of a value greater than $10^{10}$ ohms. In a preferred embodiment, source 12 and split drains 14a and 14b comprise N+ material, while buried channel conducting layer 10 comprises N material, and is disposed on a P substrate 11 comprising P-material.

In a typical operation, source terminal or node 16 is set at ground potential, the drain voltage $V_D$ applied at drain terminal or node 18 is connected to a +8 volts DC supply, and the gate voltage $V_G$ applied at gate terminal or node 28 is connected to a +2 volt DC supply. Typically, the MOSFET device will have a 1 volt DC threshold voltage so that the +2 volts applied to node 28 exceeds this level and thus carriers flow in a conducting channel (not shown). This conducting channel can be either at the interface between the P-substrate 11 and the silicon dioxide layer 20 when the buried channel silicon layer 10 is not present, or it can be within the buried channel silicon layer 10 when the buried channel silicon layer 10 is present. A bias is thus established which provides a flow of charges towards split drains 14a, 14b. Split floating gates 30a, 30b sense the amount of electron charge formed in the aforesaid conducting channel beneath each of the split floating gates 30a and 30b. The amount of charge build-up beneath each floating gate is a function of the strength of the magnetic field which causes deflection of the movement of electron charges produced by the bias voltages. This charge build-up produces a displacement current at the outputs 32a, 32b of floating gates 30a, 30b, respectively, due to capacitive coupling of the charges by the floating gates. The displacement current is inputted to differential electrometer amplifier 46 as a first floating gate signal to gate input 42 and as a second floating gate signal to gate input 44.

The amount of electron charge build-up, Q, beneath split floating gates 30a, 30b is a function of both the gate voltage $V_G$ and the length L of each floating gate. The charge Q that exists below either of the split floating gate 30a or 30b in steady state is given by:

$$Q = I\tau \qquad (3)$$

where I is the steady state current and $\tau$ is the exponential decay time constant for charge transport from beneath the floating gate by thermal diffusion. The exponential decay time constant is given by:

$$\tau = L^2/2D \qquad (4)$$

where L is, as stated above, the length of the floating gate and D is the diffusion coefficient.

The moving electron charges, resulting in the current flow generated within the aforesaid conducting channel, are deflected by the magnetic field extending perpendicular to the surface of DC voltage gate 26, as indicated by the symbol ⊙ on DC voltage gate 26 in FIG. 2. Hence, the charges are directed more towards one gate of the two split floating gates 30a and 30b. More charges thus accumulate in the region beneath that gate and the difference in charge accumulation is reflected in the corresponding output signals at respective output terminals 52, 54 of output differential electrometer amplifier 46 and the difference between these signals is an indication of the magnetic field strength.

Bias resistors 48 and 50 each comprise an undoped polysilicon load resistor with a resistance greater than $1 \times 10^{10}$ ohms in the preferred embodiment, and are used, as stated, to provide a bias voltage for split floating gates 32a and 32b, respectively. The Johnson noise associated with each bias resistor, however, represents the dominate noise component affecting the output signal of the current sensor implementation shown in FIG. 2. This noise component can be eliminated from the output signal by use of high pass filters connected to the output terminals 52, 54 of differential amplifier 46. By way of illustration, high pass filter 55 is shown connected to output 38 of MOSFET electrometer amplifier 36 in FIG. 1. Although not specifically shown in FIG. 2, high pass filters can be similarly connected to output terminals 52 and 54 of differential electrometer amplifier 46 in the dual floating gate device of FIG. 2.

The floating gate output signal appearing, for example, at output connector 32 (FIG. 1), will be passed undistorted to output terminal 57 so long as the signal frequency components are higher than the corner frequency of the high pass filter 55 connected to output 38. The filtering characteristics associated with use of a high pass filter are well known in the art and such a filter can comprise an R-C equivalent network which attenuates frequencies below a cut-off corner frequency $f_2$, and passes frequencies greater than that frequency $f_2$.

Considering the noise contribution of bias resistor $R_B$ used to provide a bias voltage at output connector 32 of floating gate 30 (FIG. 1), when used with an output high-pass pass filter 55 having a cut-off corner frequency $f_2$, a determination of the mean-square noise current associated with bias resistor $R_B$ is given by:

$$\overline{I^2}_n = (e/r\,\tau)^2\,[(kTf_1/Cf_2) + \overline{e^2}_{na}B] \qquad (5)$$

wherein the symbols are as in equations previously given, and wherein r is the floating gate responsivity and $f_1$ is the bias resistor corner frequency. In accordance with equation (5), with a sufficiently high ratio of corner frequencies $f_1$, $f_2$, the mean-square noise current will be primarily due to the amplifier equivalent input noise voltage, $e_{na}$.

A comparison of the noise produced by the floating gate current sensor with that produced by a conventional resistor load device can be attained by examining the conventional load resistor value that is required to equal the noise performance of the floating gate current sensor. This is done by equating the above equations (2) and (5), and solving for resistor load, $R_L$. The solution is:

$$R_L = 4kT/[\overline{e^2}_{na}\,[(16e^2/r^2) - (4\,\pi\,C^2/3)]] \qquad (6)$$

A plot of Equation (6) for different capacitance values at floating gate output connector 32 demonstrates that the required resistor load value, $R_L$, is inversely proportional to the square of the bandwidth and is also inversely proportional to the square of the equivalent amplifier mean-square noise voltage. Thus the noise performance of the floating gate current sensor of the invention, when compared to the resistor load approach, improves significantly as the bandwidth is reduced. Therefore, a reduction in noise and a consequent significant improvement in sensitivity is provided with a magnetic field sensor using the floating gate structure of the invention.

Another important feature of the floating gate current sensor of the invention is that the sensor is intrinsically an AC coupled detector, and thus responds only to changes in the AC current signal that is induced by an AC magnetic field. In other words, a DC current component will not be sensed, and the AC coupling eliminates a potentially large adverse DC offset component. On the other hand, one disadvantage is that because of the use of a high pass filter (e.g., filter 55) to remove the bias resistor noise, the floating gate approach described will only operate for signal frequencies above cut-off corner frequency $f_2$ of the high pass filter, and will not operate for signal frequencies below $f_2$. Typical values of the capacitance and resistance at floating gate node 32 are 0.15 picofarads and 1E10 ohms, respectively. Thus, using known R-C filtering equations, the bias resistor corner frequency at the floating gate node is approximately 50-100 Hz, yielding a cut-off corner frequency for a single-pole, high pass filter of approximately 500-1,000 Hz. This disadvantage, however, can be overcome by a second embodiment of the floating gate current sensor described below.

Figure 3A:
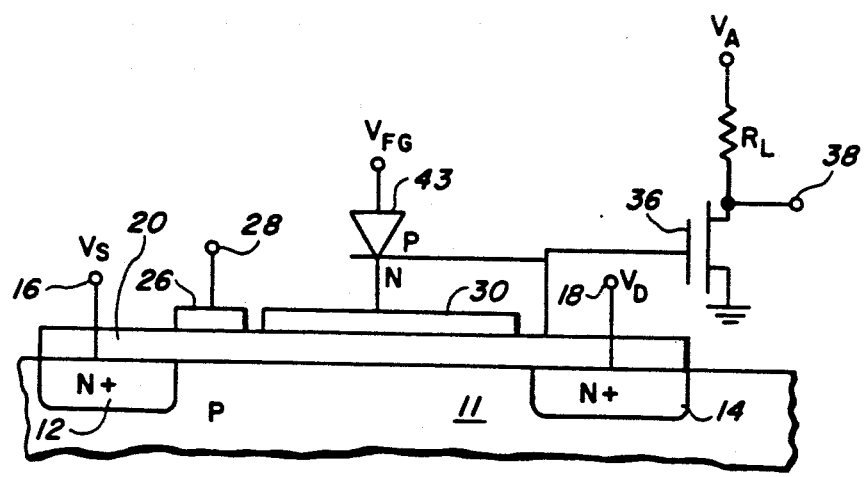
FIG. 3A is a cross sectional view of an alternative embodiment of a floating gate magnetic field sensor wherein reverse biased p-n junction diodes are used to provide biasing of the floating gate.
Figure 3:
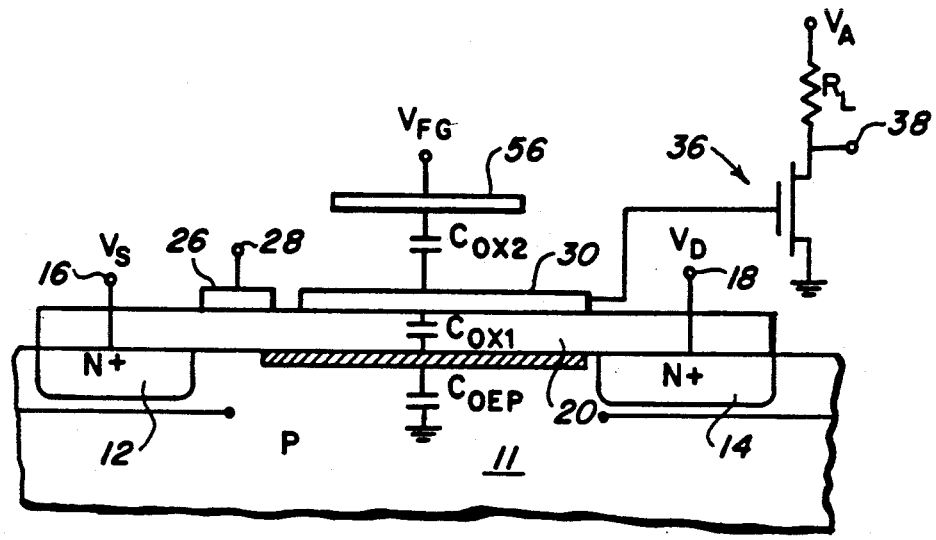
FIG. 3 is a cross-sectional view of an alternative embodiment of a floating gate magnetic field sensor wherein a metal bias electrode is used to provide a capacitive division bias to the floating gate.

In a second embodiment shown in FIG. 3, a floating gate current sensor is shown which does not require the use of a bias resistor and an associated high pass filter as in the preferred embodiment of FIG. 2 discussed above. This embodiment is similar to that of FIG. 1 and corresponding elements and components have been given the same reference numerals. In this second embodiment, the bias for floating gate 30 is provided by a floating gate voltage supply $V_{FG}$ applied to a bias electrode 56 that overlies floating gate 30. This creates a capacitance $C_{OX2}$ between bias electrode 56 and floating gate 30 so that a bias voltage is capacitively coupled to floating gate 30. The sensor is effectively DC coupled and can therefore detect low frequency magnetic fields. This implementation also has the advantage mentioned above, i.e., that noise contributions from either a load resistor or a bias resistor in the output signal are eliminated.

Referring to FIG. 3A, a further embodiment of the invention is shown. This embodiment is similar to that of FIG. 3 and like elements have been given the same reference numerals. FIG. 3A differs from FIG. 3 in that an associated reverse biased p-n diode 43 is used to bias each of the split floating gates 30a and 30b. Note that only one p-n diode 43 is shown in FIG. 3A. A reverse biased diode has a very low leakage current flow and an impedance greater than $1 \times 10^{10}$ ohms and thus provides necessary bias voltage to bias floating gates 30a and 30b.

Figure 4:
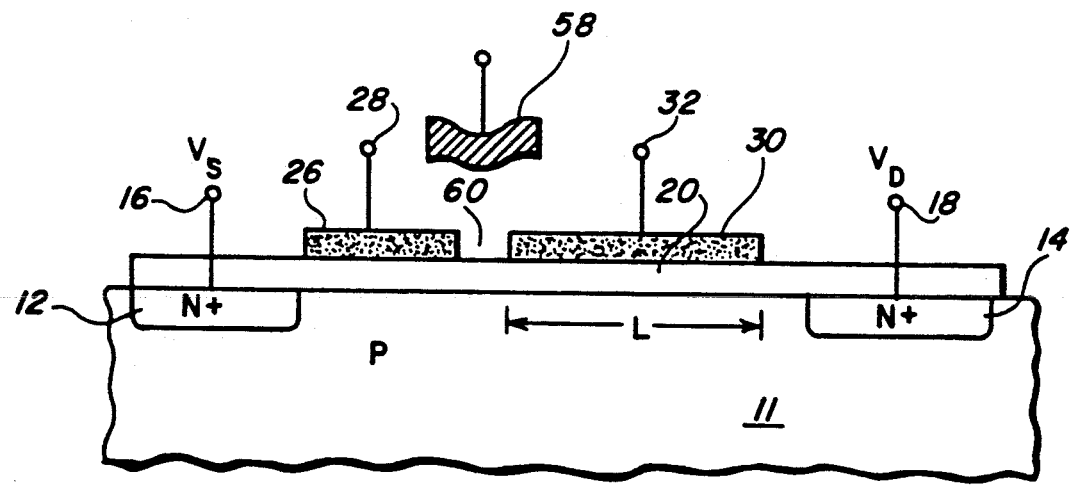
FIG. 4 is a cross-sectional view of another alternative embodiment of a floating gate magnetic field sensor in which a metal gate is used to cover a gap region between gates of the MOSFET.

Referring to FIG. 4, a further embodiment of the invention is shown. This embodiment is also similar to that of FIG. 1 and corresponding elements and components have again been given the same reference numerals. This embodiment is based on the observation that, in practice, an accumulation of electron charges may build up under a gap region, denoted 60 in FIG. 4, that exists between DC voltage gate 26 and floating gate 30. This is due to the absence of any bias voltage applied directly in this region, and results in a "well" being created in which electron charges become trapped. To combat this, in this embodiment a metal gate 58 is applied over gap region 60 between DC voltage gate 26 and floating gate 30 so as to provide additional capacitive coupling, in conjunction with that of floating gate 30, to thereby deplete the parasitic electric potential "well" created in gap region 60 due to positive charge build-up in silicon dioxide layer 20.

In a related alternative embodiment, the effect of this parasitic potential "well" is reduced or eliminated by biasing the sensor so that a small, e.g., 50 nanoamps, bias current flows across gap region 60 in order to keep the electric potential "well" substantially filled with charge, thereby preventing further electric charges from becoming lodged in the well during the operation of the sensor.

Figure 5:
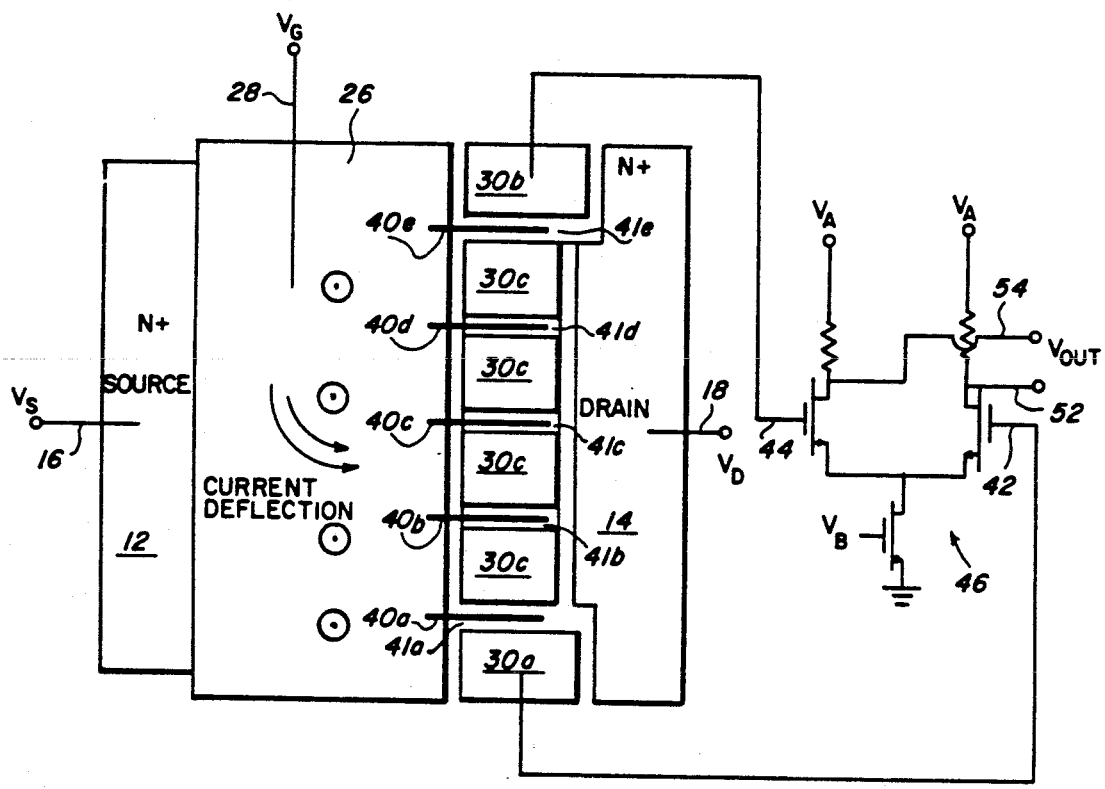
FIG. 5 is a top view of an alternative embodiment of a floating gate magnetic field sensor using dummy floating gates.

A further embodiment of the floating gate magnetic field sensor of the invention is shown in FIG. 5 which is similar to that of FIG. 2 and in which like elements have been given the same reference numerals. The embodiment of FIG. 5 employs a source 12, a single drain 14, and a layer of silicon dioxide (not shown in FIG. 5) between the source 12 and the drain 14, as discussed above in connection with the previous embodiment. Provided on top of the silicon dioxide layer (corresponding to layer 20 in the cross-sectional view of FIG. 1) is a gate assembly comprising a first DC voltage gate 26, and a pair of floating gates 30a, 30b, and a second DC voltage gate 30c arranged in a side by side relationship lying on top of charge splitters 40a-40e which are disposed in isolating barrier regions 41a-40e and which are used to prevent charge build-up between the floating gates. It should be understood that the second DC voltage gate 30c can be either a single gate or multiple gates connected to the same bias potential. Output signals are taken only at the floating gates 30a and 30b located at the two outermost edges of the MOSFET. In other words, internal DC voltage gate 30c is a "dummy" floating gate from which no output signal is taken, and can have "dummy" channels, i.e., dummy channel stops, therebetween exerting no influence on electric charges.

The use of the dummy center floating gates, as illustrated in FIG. 5, offers benefits in both sensitivity and power requirements. In this regard, much of the DC current flow in the sensor of FIG. 5 takes place under the center floating gate and this reduces the electron charge movement (current) that occurs beneath the outer two floating gates 30a and 30b as compared with the dual floating gate structure of FIG. 2. This reduction of the DC current flow under the "active" floating gates 30a and 30b results in improved sensitivity. Also, the smaller current flow is desirable in this respect because large DC currents in the aforesaid conduction channel build up more mobile carrier charges in the region beneath each floating gate (the charge build-up beneath a floating gate is a function of the amount of DC current flow). This charge build-up requires that large potential barriers be overcome, i.e., a large floating gate bias must be applied in order to handle this mobile carrier charge build-up. A reduction in the DC current reduces the required potential barrier height, and consequently reduces the gate voltage requirement for establishing the floating gate bias.

Although the invention has been described in relation to exemplary preferred embodiments thereof, it will be understood by those skilled in this art that variations and modifications can be effected in these preferred embodiments without detracting from the scope and spirit of the invention.

I claim:

1. A floating gate, magnetic field sensor for sensing the strength of a magnetic field, said sensor comprising:
 a MOSFET comprising a silicon material having a source at a first position in said silicon material, and a first drain and a second drain at a second position in said silicon material, a silicon dioxide layer disposed on said silicon material between said first and second positions, and gate means disposed between said first and second positions, said gate means comprising:

(a) a DC gate means, disposed on an upper surface of the silicon dioxide layer adjacent to said source, for receiving a DC voltage and producing, at or near the interface between said silicon material and said silicon dioxide layer, movement of electron charges along a path of travel which is a function of the strength of the magnetic field being sensed;

(b) a first floating gate means, located on an upper surface of the silicon dioxide layer adjacent to said first drain, for providing capacitive coupling to said electron charges beneath said first floating gate means and for outputting a first gate signal indicative of the electron charges therebelow;

(c) a second floating gate means, located on an upper surface of the silicon dioxide layer adjacent to said second drain, for providing capacitive coupling to electron charges beneath said second floating gate means and for outputting a second gate signal indicative of the electron charges therebelow:

(d) an isolating barrier region separating said first floating gate means and said first drain from said second floating gate means and said second drain;

(e) a charge splitter means, located in said barrier region, for preventing charges from accumulating in and adjacent to the region; and (f) output means connected to the said first and second floating gate means comprising a differential amplifier means having a first differential input connected to receive said first gate signal and a second differential input connected to receive said second gate signal, for providing a differential output signal based on said gate signals related to the strength of said magnetic field.

2. A floating gate magnetic field sensor according to claim 1, wherein said first floating gate means comprises a first floating gate and a first high impedance bias means for providing a bias voltage to said first floating gate, and said second floating gate means comprises a second floating gate and a second high impedance bias means for providing a bias voltage to said second floating gate.

3. A magnetic field sensor according to claim 2, wherein said first high impedance bias means and said second high impedance bias means each comprise a bias resistor connected between a bias voltage terminal and respective terminals of said first and second floating gates inputs.

4. A magnetic field sensor according to claim 2, wherein said first high impedance bias means and said second bias means each comprise a bias electrode overlying a respective floating gate and connected to a bias voltage terminal for providing a capacitively coupled bias voltage to each respective floating gate.

5. A magnetic field sensor according to claim 2 wherein said first and second high impedance bias means comprise reverse biased p-n diodes connected between a bias voltage terminal and respective terminals of said first and second floating gates.

6. A floating gate magnetic field sensor according to claim 3, further comprising filtering means connected to receive said differential output signal for filtering out undesired noise from the differential output signal.

7. A magnetic field sensor according to claim 1, further comprising a metal gate placed over a gap region between said DC gate means and said first and second floating gate means.

8. A magnetic field sensor according to claim 1, comprising current bias means for providing a bias current to maintain a gap region between said DC gate means and said first and second floating gates filled with electric charge.

9. A floating gate, magnetic field sensor for sensing the strength of a magnetic field, comprising a MOSFET comprising a silicon layer with a source at a first end of the silicon layer, and a drain at a second end of the silicon layer, a silicon dioxide layer on top surface of the silicon layer between the source and the drain, and gate means between said first end and said second end, the gate means comprising:

a DC gate means on a top surface of the silicon dioxide layer closest to said source for receiving a DC voltage and for producing electron charge movement within a silicon conducting channel at or near an interface between the silicon layer and the silicon dioxide layer, said electron charge movement being deflected as a function of the strength of the magnetic field being sensed;

a plurality of floating gates on a top surface of the silicon dioxide layer between said DC gate means and said drain, each floating gate being at least partially separated from an adjacent floating gate by an isolating barrier region therebetween, said plurality of floating gates includes a first floating gate and a second floating gate;

floating gate output means comprising a first output connected to said first floating gate and a second output connected to said second floating gate; and output means, connected to said first and second outputs, for providing an output signal as a function of the strength of the magnetic field.

10. A magnetic filed sensor according to claim 9, wherein said plurality of floating gates further comprise at least one d.c. voltage gate located between said first and second gates, each d.c. voltage gate being at least partially separated from an adjacent d.c. voltage gate by an isolating barrier region and being connected to a bias potential.

11. A magnetic field sensor according to claim 10, wherein said output means comprises a differential amplifier having a first input and a second input for receiving said first output and said second output, respectively, and for providing a differential output signal thereof as a function of the strength of the magnetic field.

12. A magnetic field sensor according to claim 9, comprising a current bias means for providing a bias current in a gap region between the DC gate means and a floating gate to maintain a predetermined electric charge in said gap region.

13. A floating gate, magnetic field sensor for sensing the strength of a magnetic field, said sensor comprising:

a MISFET comprising a semiconductor material having a source at a first position along said semiconductor material, and a first drain and a second drain at a second position along said semiconductor material, a passivating dielectric layer disposed on said semiconductor material between said first and second positions, and gate means disposed between said first and second positions, said gate means comprising:

(a) a DC gate means, disposed on an upper surface of said passivating layer adjacent to said source, for receiving a DC voltage and producing, at or near the interface between said semiconductor material and said passivating dielectric layer, movement of electron charges along a path of travel which is a function of the strength of the magnetic field being sensed;

(b) a first floating gate means, located on an upper surface of said passivating dielectric layer adjacent to said first drain, for providing capacitive coupling to said electron charges beneath said first floating gate means and for outputting a first gate signal indicative of the electron charges therebelow;

(c) a second floating gate means, located on an upper surface of said passivating dielectric layer adjacent to said second drain, for providing capacitive coupling to electron charges beneath said second floating gate means and for outputting a second gate signal indicative of the electron charges therebelow;

(d) an isolating barrier region separating said first floating gate means and said first drain from said second floating gate means and said second drain;

(e) a charge splitter means, located in said barrier region, for preventing charges from accumulating in and adjacent to the region; and (f) output means connected to the said first and second floating gate means comprising a differential amplifier means having a first differential input connected to receive said first gate signal and a second differential input connected to receive said second gate signal, for providing a differential output signal based on said gate signals related to the strength of said magnetic field.

14. The floating gate magnetic field sensor according to claim 13, wherein said semiconductor material is selected from the group consisting of silicon, gallium arsenide, indium phosphide and indium antimonide.

15. The floating gate magnetic field sensor according to claim 13, wherein said semiconductor material is silicon and said passivating dielectric layer is silicon dioxide.

* * * * *